(12) United States Patent
Cui et al.

(10) Patent No.: US 12,195,359 B2
(45) Date of Patent: Jan. 14, 2025

(54) PHOTOTHERMAL SEAWATER DESALINATION MATERIAL WITH MULTI-STAGE STRUCTURE AND PREPARATION METHOD AND USE THEREOF

(71) Applicant: Shandong University of Science and Technology, Qingdao (CN)

(72) Inventors: Hongzhi Cui, Qingdao (CN); Na Wei, Qingdao (CN); Xiaojie Song, Qingdao (CN); Ruiqi Xu, Qingdao (CN); Zhenkui Li, Qingdao (CN); Minggang Zhao, Qingdao (CN); Kunyu Sun, Qingdao (CN); Qi Li, Qingdao (CN)

(73) Assignee: Shandong University of Science and Technology, Qingdao (CN)

( * ) Notice: Subject to any disclaimer, the term of this patent is extended or adjusted under 35 U.S.C. 154(b) by 491 days.

(21) Appl. No.: 17/517,825

(22) Filed: Nov. 3, 2021

(65) Prior Publication Data

US 2023/0138777 A1  May 4, 2023

(51) Int. Cl.
*C01G 41/02* (2006.01)
*B01D 1/00* (2006.01)
*C01G 53/00* (2006.01)
*C02F 1/14* (2023.01)
*C23C 16/26* (2006.01)
*C23C 16/513* (2006.01)
*B82Y 30/00* (2011.01)
*B82Y 40/00* (2011.01)
*C02F 103/08* (2006.01)

(52) U.S. Cl.
CPC .............. *C02F 1/14* (2013.01); *B01D 1/0035* (2013.01); *C01G 41/02* (2013.01); *C01G 53/00* (2013.01); *C23C 16/26* (2013.01); *C23C 16/513* (2013.01); *B82Y 30/00* (2013.01); *B82Y 40/00* (2013.01); *C02F 2103/08* (2013.01); *C02F 2201/002* (2013.01)

(58) Field of Classification Search
CPC .. C02F 1/14; C02F 2103/08; C02F 2201/002; B01D 1/0035; C01G 41/02; C01G 53/00; C23C 16/26; C23C 16/513; B82Y 30/00; B82Y 40/00
USPC .......................................................... 126/676
See application file for complete search history.

(56) References Cited

FOREIGN PATENT DOCUMENTS

| CN | 110330067 A | * | 10/2019 | |
|---|---|---|---|---|
| CN | 110510689 A | * | 11/2019 | .............. C02F 1/043 |
| CN | 110510689 B | * | 9/2021 | .............. C02F 1/043 |
| JP | 2006145183 A | * | 6/2006 | |
| PL | 236633 B1 | * | 2/2021 | |
| WO | WO-2013164557 A2 | * | 11/2013 | ............... F24J 2/055 |

* cited by examiner

*Primary Examiner* — Avinash A Savani
(74) *Attorney, Agent, or Firm* — Tutunjian & Bitetto, P.C.

(57) ABSTRACT

A photothermal seawater desalination material with a multi-stage structure and a preparation method and application thereof. The photothermal seawater desalination material includes a light-absorbing material having a C/WO3-x heterogeneous junction, which is obtained by depositing a nano-C material on a porous metal foam material using plasma enhanced chemical vapor deposition (PECVD), and then synthesizing WO3-x with plasma resonance effect by a solvothermal reaction.

2 Claims, 6 Drawing Sheets

PHOTOTHERMAL SEAWATER DESALINATION MATERIAL WITH MULTI-STAGE STRUCTURE AND PREPARATION METHOD AND USE THEREOF

BACKGROUND

Field of the Invention

The present disclosure belongs to the technical field of material synthesizing and processing, and particularly refers to a photothermal seawater desalination material. Specifically, the present disclosure refers to a light-absorbing layer of nano-C/WO3-x heterogeneous junction formed on an outer surface of a porous metal that is resistant to seawater corrosion. The photothermal seawater desalination material of the present disclosure has the advantages of good corrosion resistance, low pressure drop and high photothermal efficiency.

Description of the Related Art

Seawater desalination is a resource-developing and amount-increasing technique for realizing the utilization of seawater resource, and is not influenced by the time, space and climate. The seawater desalination methods currently used include the seawater freezing method, electrodialysis method, distillation method, reverse osmosis method and ammonium carbonate ion exchange method, etc. To desalinize seawater making use of the principle of photothermal conversion is a low-cost and low-maintenance seawater desalination technology. As a clean and sustainable green energy, solar energy has become a focus of energy conversion utilization in recent years, and has been widely used in fields such as photovoltaic power generation, photocatalysis and photothermal conversion. The current photothermal conversion materials mainly include the carbon-based materials, plasmon materials and various semiconductor materials. For example:

Chinese patent application No. 201810127921.2 discloses a light-heat-steam conversion material and a preparation method thereof, wherein a photothermal conversion coating carbon black is obtained by burning a high-carbon organic matter, and a surface of a seawater absorbing material is wiped with the carbon black until the surface is completely covered by the carbon black particles. The seawater desalination system or other wastewater desalination system prepared by the invention has simple operation, cheap materials with easy access and no need to consume electric energy, and has very good stability, which is suitable for a large-scale and low-cost preparation. Chinese patent application No. 201711027271.6 discloses a method for desalinating and purifying seawater using the photothermal conversion function, wherein a multiferroic material and titanium tetrachloride are prepared into a colloid and fired into a tubular heat-to-electric conversion material to be added into a polyurethane foam board, and then a slurry of graphene and nano-titanium oxide is sprayed on the surface of the foam board to form a photothermal conversion and catalytic purification layer. After the foam board is placed on surface of seawater, the seawater is evaporated by the heating effect of the photothermal conversion and catalytic purification layer, and the organic matter is decomposed by the microelectric effect of the tubular heat-to-electric conversion material, so as to achieve the purpose of purifying seawater. Chinese patent application No. 201810605039.4 discloses a seawater desalination method based on the photothermal effect of copper nanoparticles, wherein the copper nanoparticles are covered on a cellulose film, then the cellulose film with a surface covered with the copper nanoparticles is placed on surface of the seawater to be desalinated, and the surface of the cellulose film is irradiated with a light source to evaporate the seawater, so as to realize seawater desalination. Chinese patent application No. 201810729316.2 discloses a device and a method for seawater desalination based on a graphene/porous copper composite material, wherein the method includes: during receiving light, solar radiation penetrates a top cover, and the seawater to be treated absorbs the solar radiation with the aid of a three-dimensional graphene/porous copper composite bottom plate to evaporate into seawater vapor, which condenses as meeting a low-temperature cover plate and is gathered and led into a seawater reservoir. Chinese patent application No. 201811572942.1 discloses a method for preparing a carbon dot-based foam material with a high photothermal conversion efficiency, wherein an amine compound and a phenol compound are mixed and put into a muffle furnace, and a solvothermal reaction is carried out for 0.5-48 h with the temperature being controlled at 100-1000° C. to obtain the carbon dot-based foam material with a high photothermal conversion, which is then purified.

Due to their own physical and chemical stability, the above materials are limited when being applied in the extreme environments of such as high salt mist, high temperature, high humidity and high corrosion, for example, for a separation and purification of multiple mediums such as high-salt seawater (10 wt %), brackish water, strong polar organic solvents and oil-water emulsions.

A technique relatively close to the present disclosure is from Chinese patent application No. 201910069970.X, disclosing a preparation method and application of a self-floating high-efficiency photothermal conversion seawater desalination material, wherein a black body absorbing material with a high photothermal conversion efficiency and a composite nanostructure is grown in a 3D network structure by using a chemical method. The invention may prevent a massive loss of heat energy, thus bringing high seawater vapor generation efficiency, a high corrosion resistance and a long service life. However, there are still the following drawbacks: firstly, the material is prepared by a method including two hydrothermal steps and one calcination step, and the process is complicated; secondly, a large amount of reducing agents is required to be added in the reduction process of the invention, and the cost is relatively high.

Therefore, it is desired to develop a porous light-absorbing material that not only has a good corrosion resistance and a long service life, but also has a simple process, a low cost, a good light absorption effect and a high seawater evaporation rate.

SUMMARY OF THE INVENTION

In order to overcome the technical defects of existing photothermal conversion seawater desalination materials such as complex process, high cost, low seawater evaporation rate and poor light absorption effect, the present disclosure provides a photothermal seawater desalination material with a multi-stage structure on the basis of ensuring corrosion resistance.

In certain embodiments, the photothermal seawater desalination material with a multi-stage structure can include a light-absorbing material, wherein the light-absorbing material is a C/WO3-x heterogeneous junction obtained by depositing a nano-C material on a porous metal foam material by plasma enhanced chemical vapor deposition (PECVD), and then synthesizing WO3-x with plasma resonance effect by a solvothermal reaction. In some embodiments, the porous metal foam material can be Ti, Ni or Cu.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are, therefore, not to be considered limiting of its scope, for the invention may admit to other equally effective embodiments. It is emphasized that the figures are not necessarily to scale and certain features and certain views of the figures can be shown exaggerated in scale or in schematic for clarity and/or conciseness.

DETAILED DESCRIPTION

Figure 1A:
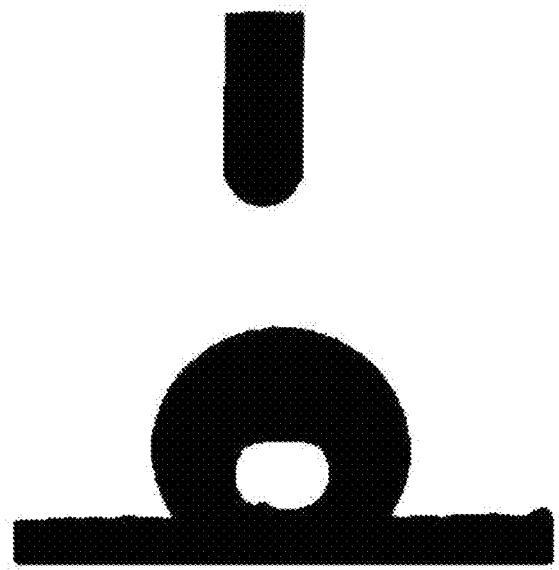
FIG. 1a and FIG. 1b are the SEM image of contact angle and surface image after illumination for 10 h of the light absorber in Example 5 of the present disclosure, respectively.

In the following discussion and in the claims, the terms "including" and "comprising" are used in an open-ended fashion, and thus should be interpreted to mean "including, but not limited to." The phrase "consisting essentially of" means that the described/claimed composition does not include any other components that will materially alter its properties by any more than 5% of that property, and in any case does not include any other component to a level greater than 3 mass %.

Unless otherwise indicated, all numerical values are "about" or "approximately" the indicated value, meaning the values take into account experimental error, machine tolerances and other variations that would be expected by a person having ordinary skill in the art. It should also be understood that the precise numerical values used in the specification and claims constitute specific embodiments. Efforts have been made to ensure the accuracy of the data in the examples. However, it should be understood that any measured data inherently contains a certain level of error due to the limitation of the technique and/or equipment used for making the measurement.

Each of the appended claims defines a separate invention, which for infringement purposes is recognized as including equivalents to the various elements or limitations specified in the claims. Depending on the context, all references to the "invention" may in some cases refer to certain specific embodiments only. In other cases, it will be recognized that references to the "invention" will refer to subject matter recited in one or more, but not necessarily all, of the claims. Each of the inventions will now be described in greater detail below, including specific embodiments, versions and examples, but the inventions are not limited to these embodiments, versions or examples, which are included to enable a person having ordinary skill in the art to make and use the inventions, when the information in this disclosure is combined with publicly available information and technology.

A photothermal seawater desalination material with a multi-stage structure on the basis of ensuring corrosion resistance and methods for making the same are provided herein. The photothermal seawater desalination material of the present disclosure can be hydrophobic as a whole. The light absorber of a C/WO3-x heterogeneous junction can have has a strong light absorption ability and photothermal conversion capacity, which is beneficial to convert the absorbed light energy into heat energy for seawater desalination in time. During seawater evaporation, the moisture may not reach the surface of the light absorber to cause salt accumulation, and thus the material has a long service life.

In one or more embodiments, the photothermal seawater desalination material with a multi-stage structure can include a light-absorbing material, wherein the light-absorbing material is a C/WO3-x heterogeneous junction obtained by depositing a nano-C material on a porous metal foam material by plasma enhanced chemical vapor deposition (PECVD), and then synthesizing WO3-x with plasma resonance effect by a solvothermal reaction. The porous metal foam material can be Ti, Ni or Cu.

The present disclosure also provides a preparation method of the material. In a first step, a nano-C material can be deposited on a surface of a pretreated porous metal foam material by PECVD. The pretreated porous metal foam material can be placed in a cavity of a tubular furnace, using CH4 as a C source, H2 as a carrier gas and Ar as a protective gas, and reacted at 800-1000° C. with a reaction time and a gas flow velocity of CH4 and H2 being controlled to obtain a porous material coated with the nano-C material. The term "nano-C material", as used herein, refers to a C material having a sheet-like structure with a nano-scale thickness. In a subsequent step or step 2, a C/WO3-x light-absorbing material can be prepared by a solvothermal reaction. The porous material coated with the nano-C material obtained above can be placed in a reaction kettle. An organic solution of WCl$_6$ can be added to the reaction kettle, and reacted at a constant temperature of 160-200° C. for 16 hr, followed by cooling naturally, washing and drying to obtain the C/WO3-x light-absorbing material.

In some embodiments, in step 1), the porous metal foam material can be pretreated using an ultrasonic washing procedure with 3 mol HCl anhydrous ethanol and deionized seawater in sequence.

In some embodiments, in step 1), the reaction time is 5-10 min, and the gas flow velocity of CH4 and H2 is (10-20) sccm and (100-200) sccm, respectively.

In some embodiments, in step 2), a solvent used for the organic solution of WCl$_6$ is isopropyl alcohol or ethanol, and a concentration of the solution is 1.25-5 g/L.

In some embodiments, in step 2), the drying is carried out at 45-55° C. for 5-7 hr.

The photothermal seawater desalination material with a multi-stage structure of the present disclosure can be used in seawater desalination. For example, the photothermal seawater desalination material provided herein can be used by combining the photothermal seawater desalination material with a polyethylene foam and cotton to form a light absorber, placing the light absorber in a polytetrafluoroethylene container loaded with seawater, then placing the polytetrafluoroethylene container on a balance and irradiating with a simulated light source, and recording changes in mass at different times to calculate a seawater evaporation rate and further to obtain a photothermal conversion efficiency, wherein the polystyrene foam is used to insulate heat and the cotton is used to transport seawater.

In the photothermal seawater desalination material provided herein, the corrosion-resistant and hydrophobic porous metal foam material can be used as a support. The coated carbon material can be hydrophobic, so the material can be hydrophobic as a whole. Moreover, the light absorber of C/WO3-x heterogeneous junction finally obtained has a strong light absorption ability and photothermal conversion capacity, which is beneficial to convert the absorbed light energy into heat energy for seawater desalination in time. During seawater evaporation, the seawater may not reach the surface of the light absorber to cause salt accumulation, and may not damage the material due to the salt accumulation, and thus the material has a long service life.

The porous material coated with C material can be synthesized by a deposition method. The light absorber can be synthesized by a one-step solvothermal method, thereby forming a multi-stage structure of foamed nickel, graphene and defective tungsten oxide. The present disclosure is simple in process, low in cost, and is suitable for a large-scale production, providing a reliable way to solve the global freshwater resource crisis.

The morphology of the light absorber described herein has a three-dimensionally interconnected pore structure, which is beneficial to the transportation of moisture and escape of steam. The testing result shows that the solar utilization efficiency of the synthesized material is up to 94%. From the change in balance reading after irradiation at one solar intensity for one hour, it is calculated that the seawater evaporation rate of the light absorber is as high as 2.1 kg m-2 h-1, which is about 4.78 times that of pure seawater, and the photothermal conversion efficiency is as high as 85%.

EXAMPLES

The technical solution of the present disclosure will be further illustrated by specific examples below. Although the following examples are directed to specific embodiments, they are not to be viewed as limiting in any specific respect. In each example, a porous nickel foam material was used as the substrate. The porous nickel foam material had a size of 2×2 cm2, a pore diameter of 100-400 μm and a porosity of 96-98%.

Example 1

Step 1): Pretreatment to Porous Metal Material

The porous foam Ni material was ultrasonically washed with 3 M HCl, anhydrous ethanol and deionized seawater for 5 min to activate the surface thereof, which was beneficial to better deposition of nano-C materials.

Step 2): Deposition of Nano-C Material by PECVD Method

The pretreated porous foam Ni material was placed in a cavity of a tubular furnace. CH4 was used as a C source, H2 as a carrier gas and Ar as a protective gas, and the gas flow velocity of CH4 and H2 were 15 sccm and 150 sccm, respectively. The materials above were kept at 1000° C. for 5 min, and then naturally cooled to obtain a porous foam Ni material coated with nano-C material.

Step 3): Preparation of C/WO3-x Light-Absorbing Material by Solvothermal Reaction The porous foam Ni material coated with nano-C material obtained above was placed in a 50 mL reaction kettle. 0.05 g of WCl6 powder was weighed and dissolved in 40 mL of isopropanol, stirred with ultrasonic for 1 h, and poured into the reaction kettle after a uniform and stable solution was formed. The materials above were kept at 180° C. for 16 h. After cooling naturally, the porous Ni material was taken out, then washed with anhydrous ethanol and deionized water, and dried in an oven at 50° C. for 6 h to obtain a C/WO3-x light-absorbing material.

Testing results showed that the light-absorbing material in Example 1 had a solar utilization efficiency as high as 85%, a seawater evaporation rate as high as 1.85 kg m-2 h-1, which was about 4.02 times that of pure seawater, and a photothermal conversion efficiency as high as 77%.

Example 2

Example 2 was different from Example 1 only in that: the temperature kept in step 3) was changed to 200° C. The rest of the processes and parameters were the same as those of Example 1.

Testing results showed that the light-absorbing material in Example 2 had a solar utilization efficiency as high as 81%, a seawater evaporation rate as high as 1.78 kg m-2 h-1, which was about 3.87 times that of pure seawater, and a photothermal conversion efficiency as high as 73%.

Example 3

Example 3 was different from Example 1 only in that: the temperature kept in step 3) was changed to 160° C. The rest of the processes and parameters were the same as those of Example 1.

Testing results showed that the light-absorbing material in Example 3 had a solar utilization efficiency as high as 82%, a seawater evaporation rate as high as 1.8 kg m-2 h-1, which was about 3.91 times that of pure seawater, and a photothermal conversion efficiency as high as 74%.

By comparing Examples 1-3, it may be seen that under other conditions unchanged, the effect of solvothermal reaction temperature on the performances of the final material cannot be ignored. An excessively low or high temperature will cause a decrease in the light absorption performance, and thus a decrease in the seawater evaporation rate.

Example 4

Example 4 was different from Example 1 in that: in step 2), the gas flow velocity of CH4 and H2 were 10 sccm and 100 sccm, respectively, and the temperature was kept at 800° C. for 10 min; in step 3), the amount of WCl6 was changed to 0.2 g, and the drying was changed to be conducted at 45° C. for 7 h. The rest of the processes and parameters were the same as those of Example 1.

Testing results showed that the light-absorbing material in Example 4 had a solar utilization efficiency as high as 90%, a seawater evaporation rate as high as 2.0 kg m-2 h-1, which was about 4.3 times that of pure seawater, and a photothermal conversion efficiency as high as 83%.

Example 5

Example 5 was different from Example 1 in that: in step 2), the gas flow velocity of CH4 and H2 were 20 sccm and 200 sccm, respectively, and the temperature was kept at 900° C. for 8 min; in step 3), the amount of WCl6 was changed to 0.125 g, and the drying was changed to be conducted at 55° C. for 5 h. The rest of the processes and parameters were the same as those of Example 1. The performances of the obtained light absorber are shown in FIG. 1a, FIG. 1b, FIG. 2, FIG. 3a and FIG. 3b.

Testing results showed that the light-absorbing material in Example 5 had a solar utilization efficiency as high as 94%, a seawater evaporation rate as high as 2.1 kg m-2 h-1, which was about 4.78 times that of pure seawater, and a photothermal conversion efficiency as high as 85%.

Example 6

Example 6 was different from Example 5 only in that: the amount of WCl6 in step 3) was changed to 0.2 g. The rest of the processes and parameters were the same as those of Example 5.

Testing results showed that the light-absorbing material in Example 6 had a solar utilization efficiency as high as 89%, a seawater evaporation rate as high as 1.95 kg m-2 h-1, which was about 4.24 times that of pure seawater, and a photothermal conversion efficiency as high as 81%.

By comparing Examples 5 and 6, it is found that an excessive addition of WCl6 will adversely affect the light absorption performance in turn, under other conditions unchanged.

Example 7

Example 7 was different from Example 5 only in that: the isopropanol in step 3) was changed to anhydrous ethanol. The rest of the processes and parameters were the same as those of Example 5.

Testing results showed that the light-absorbing material in Example 7 had a solar utilization efficiency as high as 89%, a seawater evaporation rate as high as 1.96 kg m-2 h-1, which was about 4.26 times that of pure seawater, and a photothermal conversion efficiency as high as 81%.

By comparing the test results of Examples 7 and 5, it is found that the choice of solvent in the solvothermal step is important. Compared with anhydrous ethanol, isopropanol is more beneficial to the test results.

Figure 1B:
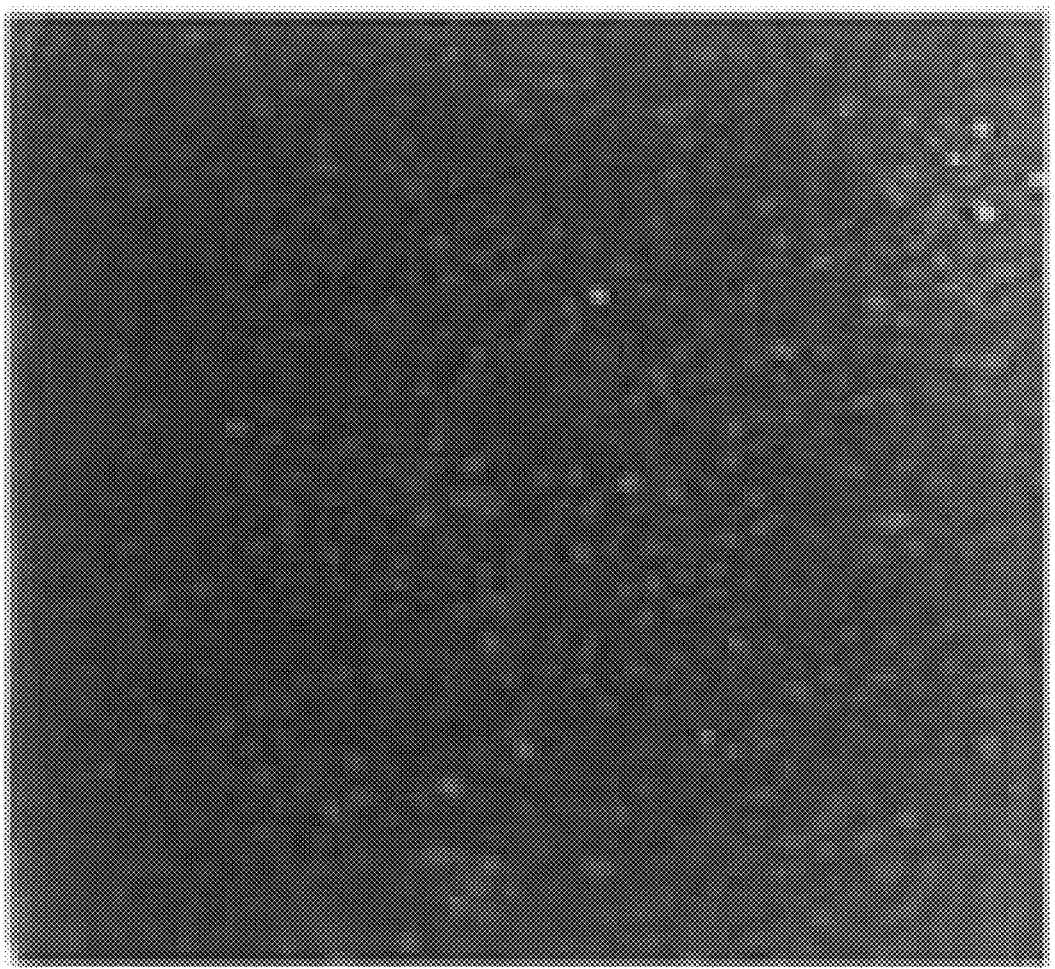
Figure 2:
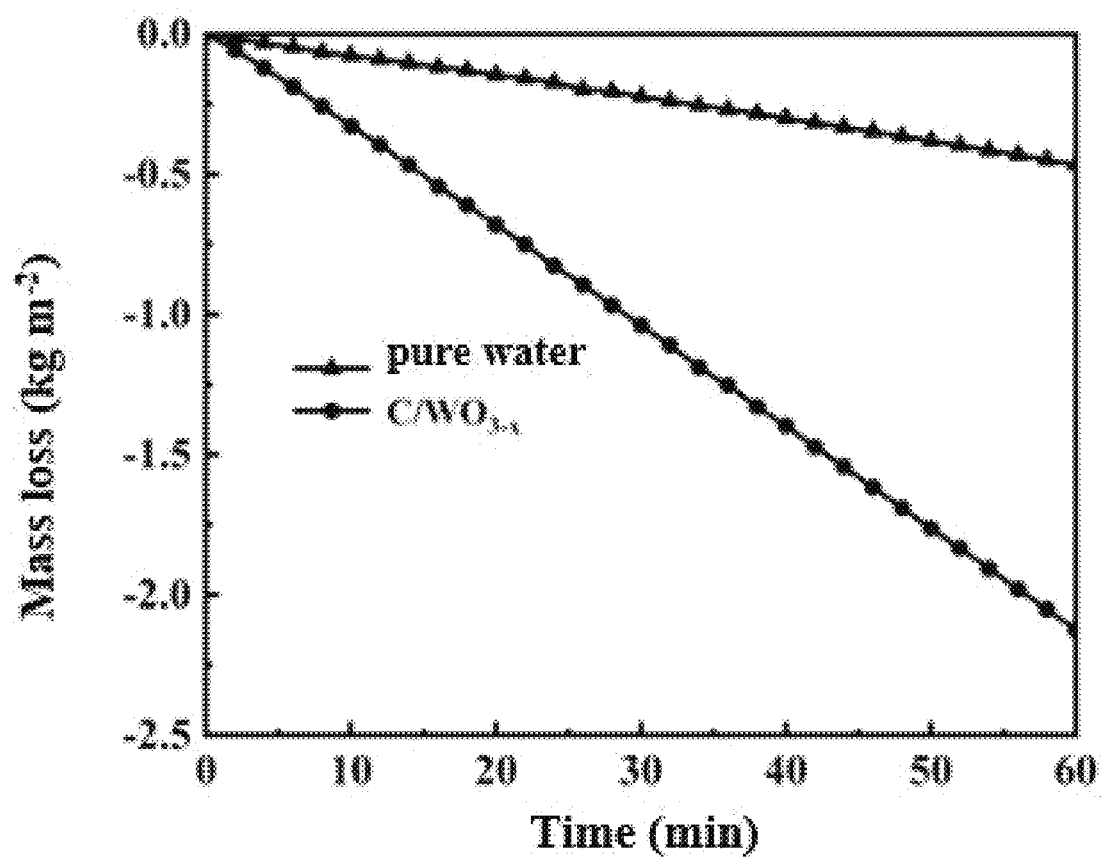
FIG. 2 is a graph of the evaporation rate of the light absorber in Example 5 of the present disclosure.
Figures 3A, 3B:
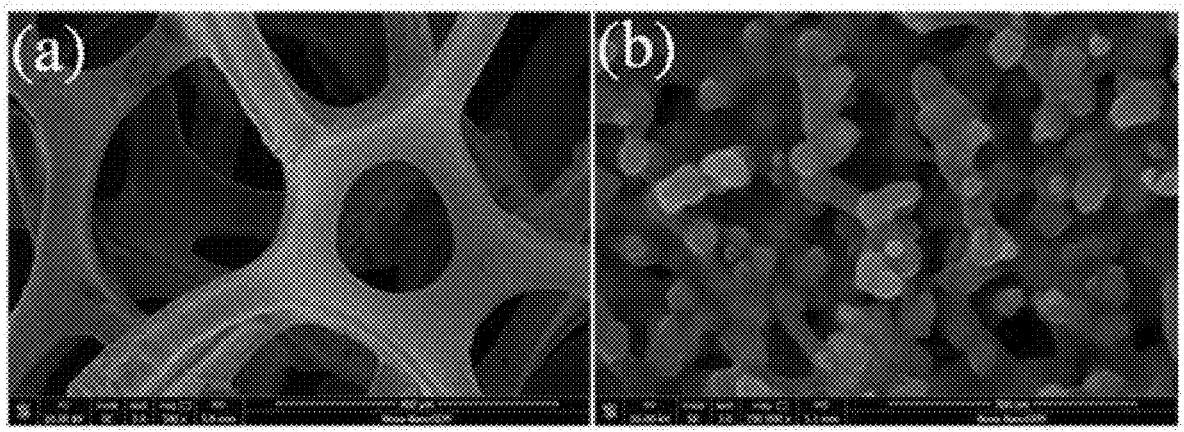
FIG. 3a and FIG. 3b are the morphology scanning images of the light absorber in Example 5 of the present disclosure with magnification of 500 times and 350,000 times, respectively.
Figure 4:
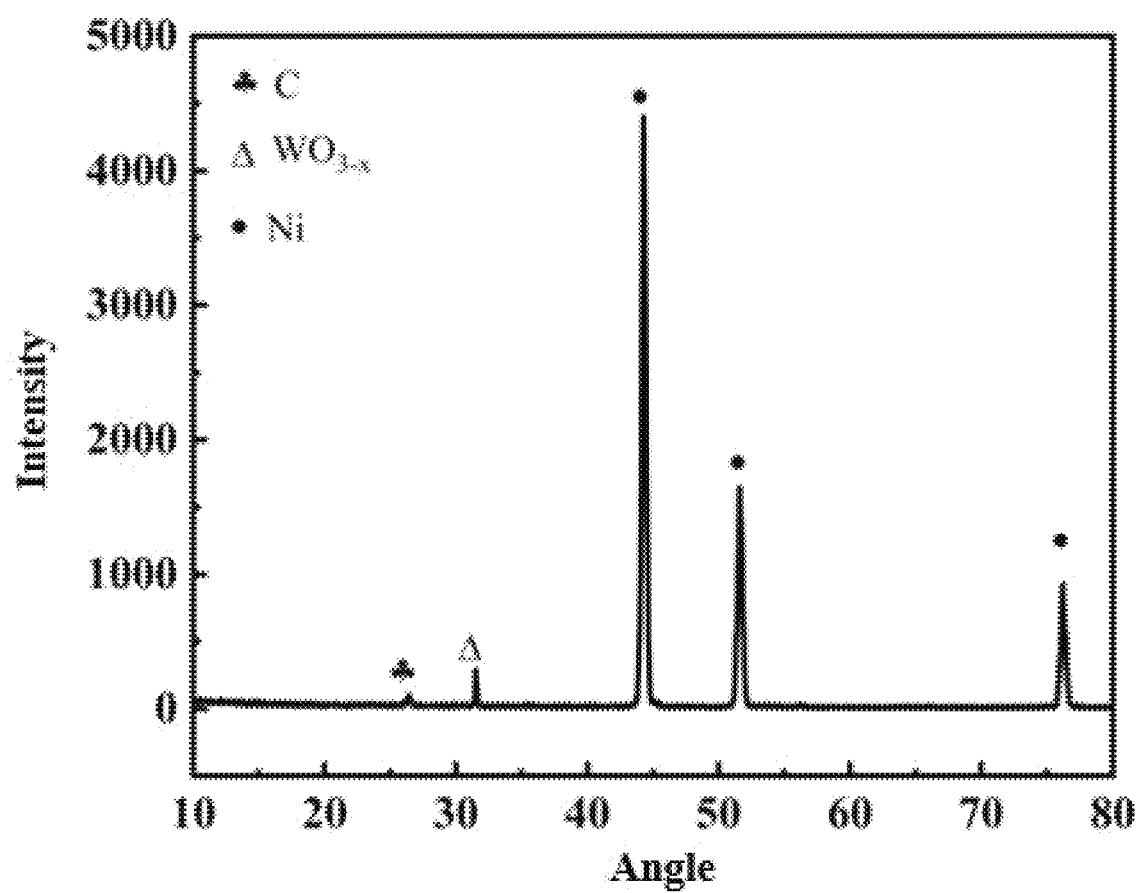
FIG. 4 is a XRD diffraction pattern of the light absorber of the present disclosure.
Figure 5:
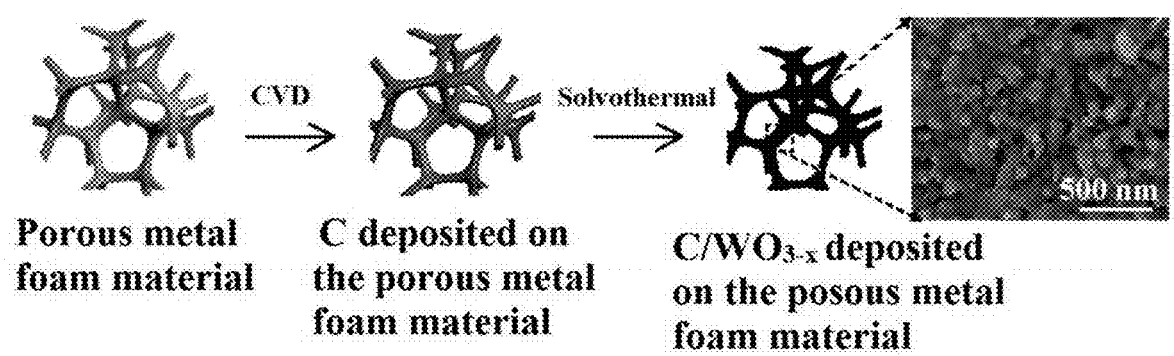
FIG. 5 is a diagram showing the structure of the photothermal seawater desalination material according to one of the embodiments.

FIG. 1a and FIG. 1b are SEM images of contact angle and surface image after illumination for 10 hr of the light absorber in Example 5 of the present disclosure. FIG. 2 is a graph of the evaporation rate of the light absorber in Example 5 of the present disclosure. FIG. 3a and FIG. 3b are the morphology scanning images of the light absorber in Example 5 of the present disclosure with magnification of 500 times and 350,000 times, respectively. FIG. 4 is a XRD diffraction pattern of the light absorber of the present disclosure.

From FIG. 1a and FIG. 1b, that is, the SEM image of contact angle and the surface image after 10 h of illumination of the light absorber in Example 5 of the present disclosure, it may be seen that the light absorber of the present disclosure is hydrophobic on surface, and during seawater evaporation, the moisture will not reach the surface of the light absorber to cause salt accumulation.

It may be seen from FIG. 2 of an evaporation rate curve of the light absorber in Example 5 of the present disclosure that the synthesized material has a solar utilization efficiency as high as 94%, a seawater evaporation rate as high as 2.1 kg m-2 h-1, which is about 4.78 times that of pure seawater, and a photothermal conversion efficiency as high as 85%.

It may be seen from the morphology scanning images of the light absorber in Example 5 of the present disclosure with magnification of 500 times and 350,000 times shown in FIG. 3 that the synthesized material has a three-dimensionally interconnected pore structure, which is beneficial to the transportation of moisture and the escape of steam.

It may be seen from the diffraction diagram shown in FIG. 4 that the synthesized material contains the components of carbon and tungsten oxide, indicating that the technical solution of the present disclosure is feasible.

The above is only specific embodiments of the present disclosure, and the protection scope of the present disclosure is not limited thereto. Any modification or substitution made without creative work should be included within the scope of the present disclosure. Therefore, the protection scope of the present disclosure should be subject to the scope of protection defined by the claims that follow.

What is claimed is:

1. A photothermal seawater desalination material with a multi-stage structure, comprising a light-absorbing material, wherein the light-absorbing material is a C/WO3-x heterogeneous junction obtained by depositing a nano-C material on a porous metal foam material using plasma enhanced chemical vapor deposition (PECVD), and then synthesizing WO3-x with plasma resonance effect by a solvothermal reaction;

wherein the photothermal seawater desalination material has a multi-stage structure of foamed nickel, graphene and defective tungsten oxide; and the photothermal seawater desalination material has a three-dimensionally interconnected pore structure.

2. The photothermal seawater desalination material with a multi-stage structure according to claim 1, wherein the porous metal foam material is a porous metal material of Ti, Ni or Cu.

* * * * *